(12) United States Patent  
Blackwood

(10) Patent No.: US 6,747,464 B1  
(45) Date of Patent: Jun. 8, 2004

(54) WAFER HOLDER FOR BACKSIDE VIEWING, FRONTSIDE PROBING ON AUTOMATED WAFER PROBE STATIONS

(75) Inventor: Jeff E. Blackwood, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 220 days.

(21) Appl. No.: 09/888,302

(22) Filed: Jun. 21, 2001

(51) Int. Cl.[7] .............................................. G01R 31/02
(52) U.S. Cl. ....................................... 324/752; 324/765
(58) Field of Search .......................... 324/765, 750–754, 324/501; 438/14–18; 356/237.1; 250/227.26, 231.1, 492.2

(56) References Cited

U.S. PATENT DOCUMENTS 5,493,236 A  *  2/1996  Ishii et al. ................... 324/501
5,959,461 A  *  9/1999  Brown et al. ................ 324/753

* cited by examiner

Primary Examiner—Vinh P. Nguyen
(74) Attorney, Agent, or Firm—Conley Rose, P.C.

(57) ABSTRACT

An integrated circuit test apparatus and a method for testing an integrated circuit are described. The integrated circuit test apparatus includes a holder adapted to receive a wafer, where a frontside of the wafer is accessible to be probe tested by electrically conducting probe needles during which a backside of the wafer is accessible to be scanned by an optical scanning mechanism. The scanning mechanism can optically detect photoemission-generated defects resulting from electrical stimuli applied to the integrated circuits via the probe needles. The holder is coupled to a three-dimensional translational mechanism that will allow for automated multi-die test probing.

17 Claims, 4 Drawing Sheets

WAFER HOLDER FOR BACKSIDE VIEWING, FRONTSIDE PROBING ON AUTOMATED WAFER PROBE STATIONS

BACKGROUND OF THE INVENTION

1. Field of the Invention

This invention relates to semiconductor device electrical test systems, and more particularly to semiconductor device electrical test systems that allow for backside viewing of a semiconductor device while electrically probing its frontside.

2. Description of the Related Art

The following descriptions and examples are not admitted to be prior art by virtue of their inclusion within this section.

A wafer fabrication process typically forms multiple identical integrated circuits upon and within frontside surfaces of each of several semiconductor wafers processed as a group (i.e., lot). Each individual integrated circuit is formed within a die area of one of the semiconductor wafers. Following wafer fabrication, the dice are subjected to "wafer sort" electrical testing, then separated from the wafers. Fully functional die are typically packaged and sold as individual semiconductor devices.

Wafer sort electrical testing is performed to ensure each integrated circuit functions properly according to a predetermined electrical specification. Following wafer fabrication, each wafer is typically placed, with the frontside surface of the dice facing up, upon a flat surface of a test system such as a wafer holder that can move in three-dimensions. A wafer under test is raised up by a translation stage until bonding pads of one of the integrated circuits contact fine probe needles of the test system. The test system may provide electrical power to the integrated circuit via some of the probe needles, and may provide input signals and/or receive output signals from the integrated circuit via other test probe needles. The wafer under test may be automatically lowered, repositioned, and raised again until all of the integrated circuits formed on the wafer under test have been tested via an automated probe station. A microscope may be mounted above the wafer surface to view the frontside surface of the wafer, where the microscope can be adapted for optical scanning of the die for photoemission-generating defects.

In recent years there has been an increase in the overall density of metal used in many integrated circuits near or at the frontside surface. This trend has led to the difficulty of optically detecting photoemission-generating defects of the dopant and thin-film areas that lie beneath the metal layers. Accordingly, it is difficult to scan the frontside surface of the individual die on the wafer. Flip-chip technology has compounded this problem. Flip-chip technology has become increasingly popular during the last few years, as the demand for more efficient and higher-density packaging of integrated circuits has markedly increased. The individual die, in the case of flip-chip technology, are manufactured to have the input/output (I/O) bonding pads of the die placed in a two-dimensional array across the frontside of the integrated chip as opposed to being placed on the perimeter of the die as found in conventional peripheral-terminal device dies. The flip-chip manufactured die in the process of being packaged is inverted (hence the term "flip-chip") and the I/O pads of the die are solder-bump attached to a corresponding array of bonding pads on an upper surface of a packaging substrate. The packaging of flip-chip die save space on the packaging substrate, which allows for higher integrated circuit density packing, and the solder-bumps attachments allow for more efficient electrical coupling between the integrated circuits and the packaging substrate. However, the two-dimensional array of metal I/O pads on the frontside surface of the flip-chip die essentially precludes frontside viewing for photoemission-generating defects as done on existing conventional automated probe stations.

It is then desirable to provide a means for backside viewing of the wafer for optical scanning of photoemission-generating defects. A benefit would arise if such can be accomplished on existing frontside viewing and frontside probing automated probe stations. The desired backside viewing should be accomplished by inverting the wafer instead of inverting the microscope, because inverting the microscope would further require re-engineering of the existing frontside viewing automated probe stations to allow for an unobstructed view of the backside surface of the wafer.

SUMMARY OF THE INVENTION

The problems outlined above may be in large part addressed by an improved integrated circuit test apparatus with a holder that is coupled to a three-dimensional translational mechanism. The holder is preferably adapted to receive a wafer that is inverted so that electrical probing can occur on the frontside of the wafer while the backside of the wafer can be concurrently viewed with an optical scanning mechanism configured above the test apparatus. According to one embodiment, the three-dimensional translational mechanism may be from a preexisting probe station, i.e., one that probes the frontside while viewing the frontside of the wafer. The integrated circuit test apparatus includes at least one electrically conducting probe needle for establishing electrical contact with the input/output (I/O) bonding pads of the individual die of the wafer undergoing testing. There may be as many as four or more probe needles used to make contact with the wafer. The three-dimensional translational mechanism allows for the movement of the holder in the x, y, and z directions for moving the wafer relative to the electrically conducting probe needles. In accordance with a specification of the layout of the dice on the wafer, the three-dimensional translational mechanism may be further configured to automatically step or reposition the wafer after probing an individual die to move to the next die in succession for automated multi-die probing of any select number of dice on the wafer.

The electrical conducting probe needles are each preferably attached to a probe base, where the probe base is configured to allow for the adjustment of the probe needles to align with I/O pads of a die to undergo probe testing. The probe base is in electrical communication with an external integrated circuit testing unit and power supply. In another embodiment, the probe needles may originate from a probe card. The optical scanning mechanism is adapted to detect photoemission-generated defects of the integrated circuits in the wafer by scanning the backside surface of the wafer that is undergoing frontside electrical probe testing. The optical scanning mechanism may include, among other things, a magnifying and focusing lens, an electromagnetic radiation beam source or electron beam source, and a microscope, where the microscope may be is a charged coupled device (CCD).

In addition to the testing apparatus discussed above, a method for testing an integrated circuit is contemplated herein. The method for testing an integrated circuit on a wafer may include holding the wafer in an inverted position with a holder. Electrically conducting probe needles are used to probe integrated circuits with I/O bonding pads on a frontside surface of the wafer and while optically scanning the backside surface of the wafer, and moving the wafer in the interim between each probing operation.

Moving the wafer in the interim between each probe operation is achieved by using a three-dimensional translational mechanism coupled to the holder, which allows the wafer that is retrofittedly attached to the holder to be moved in the x, y, and z directions. The three-dimensional translational mechanism may be configured in accordance with a specification of the layout of the die on the wafer, to incrementally step or automatically move from the last die tested to the next die on the wafer for any select number of die on the wafer.

Optically scanning the backside surface of the wafer is accomplished by an optical scanning mechanism, where the optical scanning mechanism may scan the backside of the wafer with a beam of electromagnetic radiation. The beam of electromagnetic radiation may be a beam of infrared radiation, since the backsides of wafers typically consists of single crystalline silicon, which is readily transparent to this wavelength of radiation. The optical scanning mechanism is adapted to determine defect-generated photoemissions as viewed from the backside while the integrated circuits undergoing electrical probe. The photoemission-generated defects may indicate the source and type of integrated circuit failures on or near the frontside surface, such as circuit shorts, junction leakage, step coverage problems, electromigration, oxide leakage, pinhole oxide layer defects, etc.

The backside surface of the wafer may be scanned by an optical scanning mechanism which can detect defect-generated photoemissions arising from the integrated circuits of the wafer undergoing frontside probing. Thus, electrical stimuli can take place on the active circuits near the frontside via the probe needles, while the result can be optically examined via the microscope. When stimuli is applied to the circuits via the probe needles, photoemission may or may not occur depending on the nature of the defect. Fortunately, the photoernission can be viewed through the optically translucent substrate. Thus, any brightness or opaqueness in a given circuit, as a result of electrical current and voltage applied to that circuit, will register during microscopic examination from the backside surface.

BRIEF DESCRIPTION OF THE DRAWINGS

Other objects and advantages of the invention will become apparent upon reading the following detailed description and upon reference to the accompanying drawings in which:

FIG. 1b is partial view of a frontside surface of the wafer in FIG. 1a;

Figure 1A:
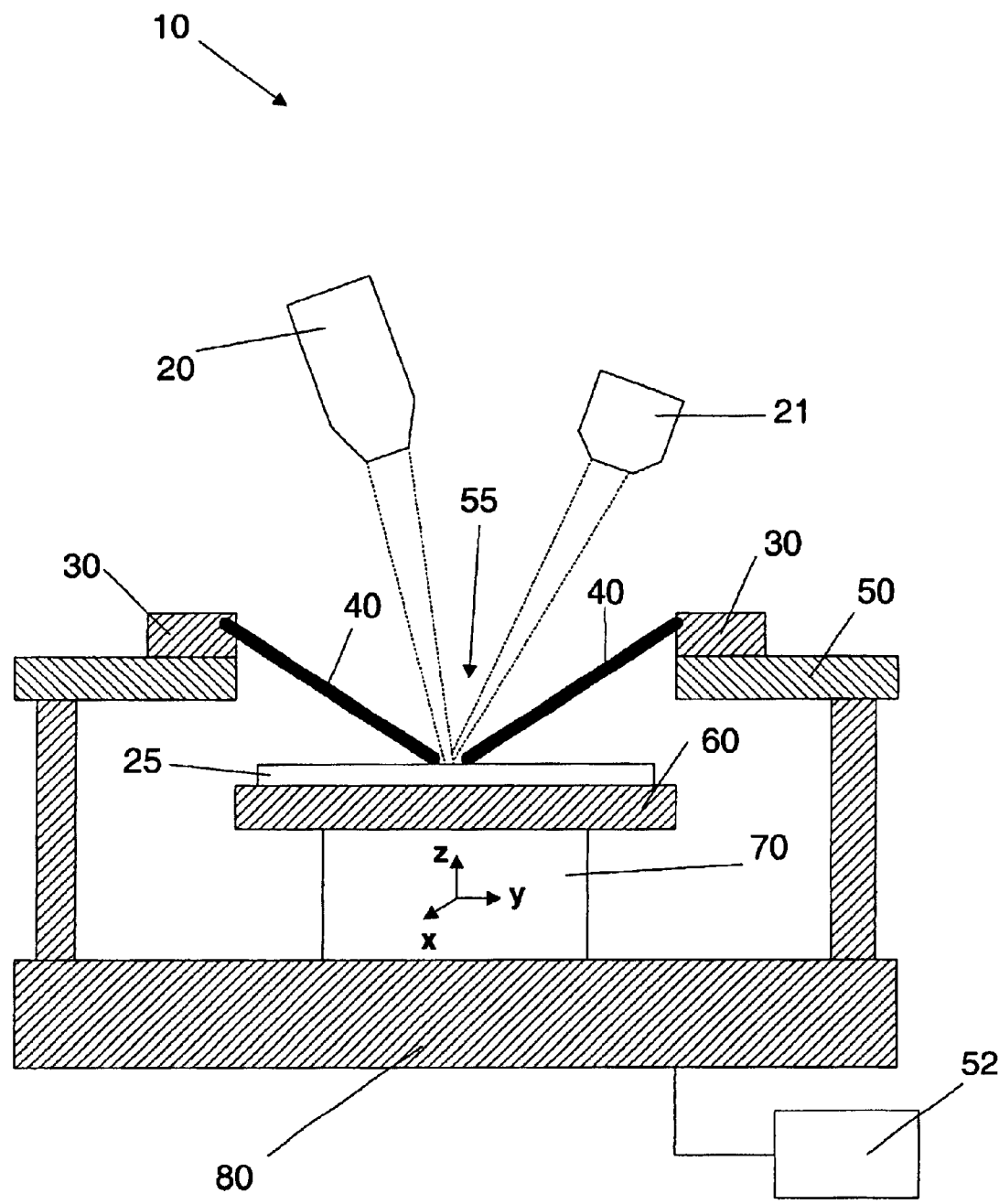
FIG. 1a is a partial cross-sectional view of an automated integrated circuit test apparatus, which allows for frontside viewing while probing the frontside surface of a wafer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning to the drawings, exemplary embodiments of a method for testing integrated circuits on a wafer are shown. FIG. 1a is a partial cross-sectional view of an integrated circuit test apparatus 10 for frontside viewing while conducting automated frontside probing of a wafer, which includes holder 60 mounted to three-dimensional translational mechanism 70. Holder 60 is designed to receive and retain a backside bottom surface of a wafer 25 to be tested by typically applying vacuum pressure from the upper surface of holder 60 to the backside bottom surface of wafer 25. Probe station housing 80 provides base support to integrated circuit test apparatus 10. Platen 50 is suspended above holder 60 and has a generally circular opening 55, which allows probe needles 40 and optical scanning mechanism 20 to have access to the frontside of the wafer to be tested.

Probe needles 40 are electrically conductive probes that are to be positioned where the end of probe needles 40 makes electrical contact with input/output (I/O) bonding pads of an individual die on the frontside upper surface of wafer 25. Probe needles 40 are shown to originate from probe bases 30 where probe bases 30 may include micropositioning adjusters, which allow for fine adjustment of probe needles 40 in the x, y, and z directions. Camera 21 is preferably attached to platen 50 and enables one to view probe needles 40 for positioning probe needles 40 and/or the wafer. There may be as many as four or more probe bases 30, each with an individual probe needle 40 for testing the wafer. The probe needle or needles could originate from a probe card, which typically has many probe needles emanating around its circumference for probing the wafer. Furthermore, either probe bases 30 or a probe card is electrically connected to a testing control unit 52, which provides electrical power/grounding and sends/receives other electrical signals for testing of the integrated circuits on the wafer.

Three-dimensional translational mechanism 70 coupled to holder 60 allows for the movement of the wafer undergoing testing in the three independent x, y, and z directions. Furthermore, three-dimensional translational mechanism 70 is electrically connected to testing control unit 52, which allows for the automatic positioning of the individual die to be tested on the wafer by moving holder 60 up and down in the z-plane and incrementally stepping it a predetermined distance in the xy-plane. Typically, the automated probing process begins with the probe needles 40, which may be finely adjusted by said micropostioner adjusters to make initial contact with appropriate I/O bonding pads of a specific predetermined starting die to be tested on the wafer.

Connected to translational mechanism 70 is preferably a motor. The motor, when energized, moves holder 60 in the x, y, or z directions. Typically, mechanism 70 is situated such that probe needles 40 are placed in a "home" position on the wafer above a given integrated circuit. Before placing the wafer in a home position, it must be assured that when mechanism 70 moves in x direction, incrementally across the wafer, the probe needle strikes corresponding probe pads consistently across the wafer for each respective die. This implies that camera 21 be used in conjunction with a set-up procedure, where mechanism 70 scans back and forth in an x direction, and an operator via camera 21 measures the amount of differences registered in the y direction. Once the y-direction differences are removed by the operator manually rotating holder 60, mechanism 70 is said to be calibrated in the x direction. Of course, the aforementioned calibration technique represents only one of possibly numerous ways to register probe needles on bonding pads in a consistent (calibrated) step-and-repeat fashion.

Once calibrated, the dimensions of each die are entered into the motor connected to mechanism 70. Thereafter, holder 70 is moved in the y direction to register probe needles 40 directly above the corresponding bonding pads of the integrated circuit on wafer 25. This is generally done when the wafer is in the home position. Thereafter, automated probing can take place, beginning at the home position and incrementing the pre-measured distance across the wafer to the next integrated circuit, moving mechanism 70 in the y direction, making contact between the bonding pads and the probe needles, forwarding the stimulus current and voltage to the probe needles, and measuring the resulting values from the probe needles. This is repeated automatically between each integrated circuit across the entire wafer, with defective integrated circuits being noted. The defective integrated circuits will be noted as those which will not be packaged for shipment to a customer.

Optical scanning mechanism 20 is adapted for photoemissions microscopy, wherein it may include, inter alia, a magnifying and focusing lens, an electromagnetic radiation source, and a camera, where the camera may be a charged coupled device (CCD) camera. Optical scanning mechanism 20 is positioned over the wafer so as to be in view of the die that is undergoing testing. In an embodiment the dice are electrically test probed with probe needles 40 in contact with the frontside dice I/O contacts to provide grounding and powering up of the integrated circuits to ready or standby condition, and/or activate the circuits. If probe testing notes a defective integrated circuit and/or a non-functional test outcome, then photoemission analysis will be performed. Photoemission analysis involved optically scanning the frontside surface with either a beam of electromagnetic radiation or electrons in order to detect photoemission-generated defects such as shorts, juncture leakages, pinhole defects in the oxide layers, latch-up, hot-carrier gate generation, etc.

Figure 1C:
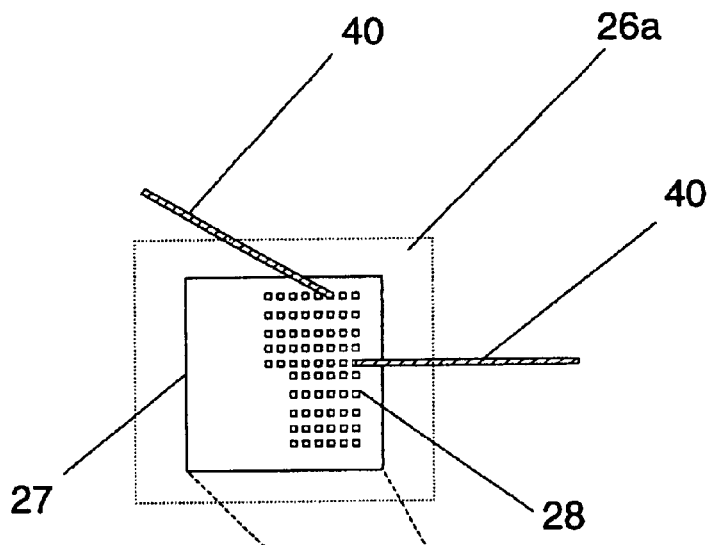
FIG. 1c is exploded view of a portion of the frontside of the wafer in FIG. 1b, which exhibits an individual die being probed.
Figure 1B:
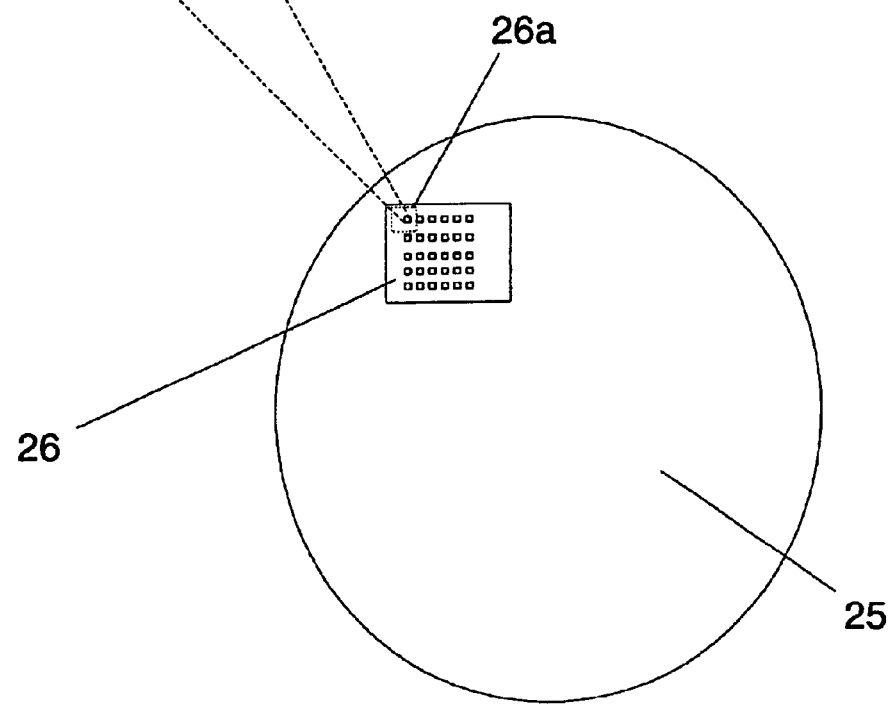

FIG. 1b is a partial view of a frontside surface of wafer 25 of FIG. 1a Section 26 shows the individual die on wafer 25. FIG. 1c is an exploded view of portion 26a of wafer 25, which shows a frontside surface of individual die 27. Die 27 is depicted as a flip chip designed die with a two-dimensional array of I/O bonding pads 28 placed across the frontside surface of die 27. Die 27 has probe needles 40 contacting some of its I/O bonding pads 28 for illustrating said frontside probing of an individual die. In another embodiment die 27 may be a peripheral terminal device with I/O bonding pads place on the perimeter of the die.

Figure 2:
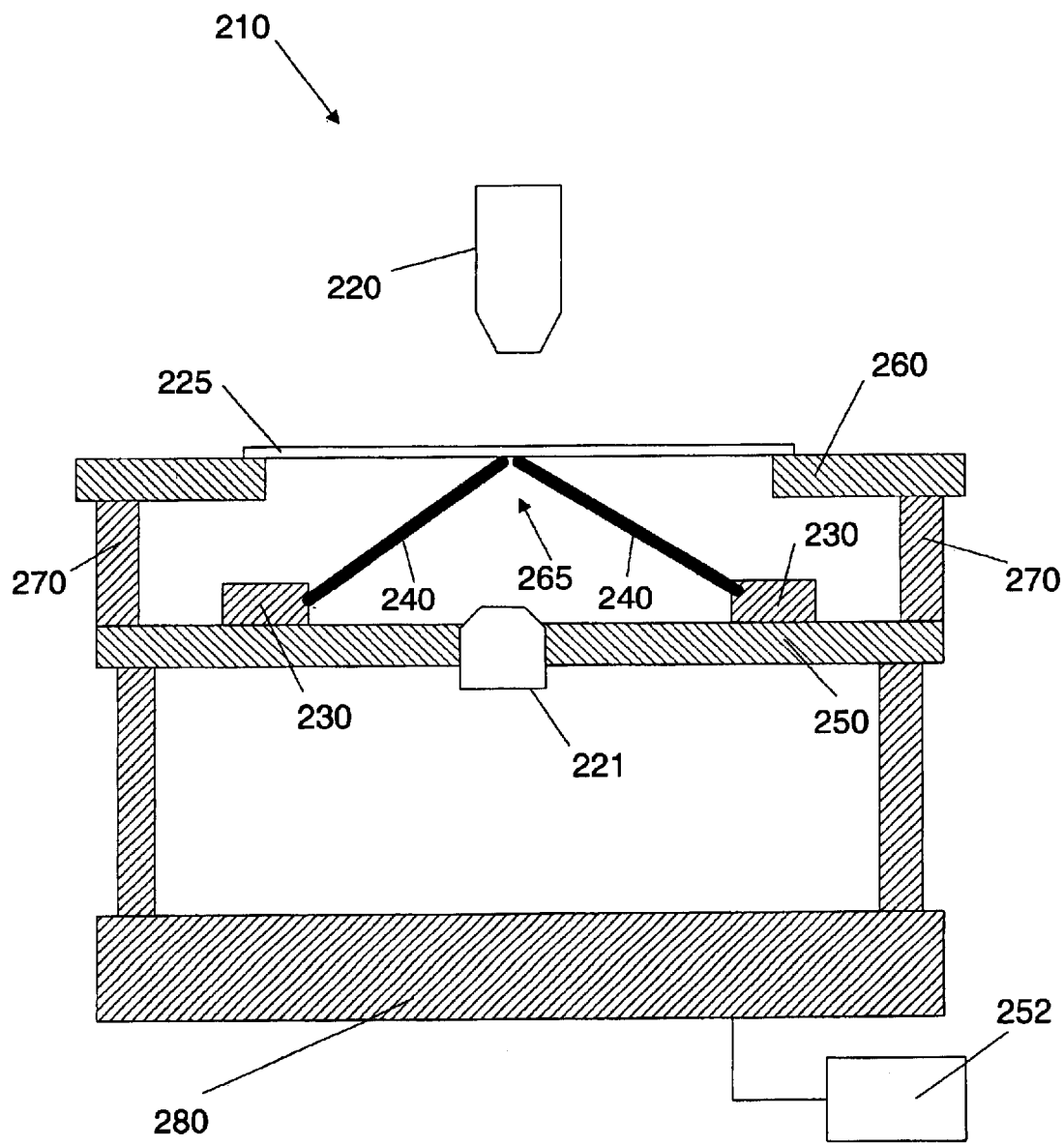
FIG. 2 is a partial cross-sectional view of a non-automated integrated circuit test apparatus, which allows for backside viewing while probing the frontside surface of a wafer.

FIG. 2 is a partial cross-sectional view of integrated circuit test apparatus 210 adapted for backside viewing while conducting frontside probing of a wafer. Probe station housing 280 is a base support for integrated circuit test apparatus 210. Holder 260 is designed to receive and retain an outer perimeter of a frontside surface of inverted wafer 225. This can be achieved by using attachment tabs or may be by applying vacuum pressure from the upper surface of holder 260 to the outer perimeter of the frontside surface of inverted wafer 225. Furthermore, holder 260 has circular opening 265 in the middle of it in order to allow probe needle 240 access to the frontside surface of inverted wafer 225. Probe needle 240 is an electrically conducting probe. During testing of the wafer, probe needle 240 is positioned to make electrical contact with an I/O bonding pad on the frontside surface of inverted wafer 225. Probe needle 240 is shown to originate from probe base 230, where probe base 230 may include micropositioning adjusters, which allow for fine adjustment of probe needle 240 in the X, Y, and Z directions.

Camera 221 is preferably attached to platen 250 in order to able to view probe needle 240 in relationship with the wafer for positioning probe needle 240 and/or inverted wafer 225 relative to one another. There may be as many as four or more probe bases 230 each with an individual probe needle 240 for testing the wafer. The probe needle or needles could originate from a probe card which has many probe needles emanating around it circumference for probing the wafer. Furthermore, either probe bases 230 or a probe card is electrically connected to a testing control unit 252, which provides electrical power and grounding and sends other electrical signals for testing of the integrated circuits on inverted wafer 225.

Holder 260 is attached to the frame of integrated circuit test apparatus 210 and is not attached to an automated system for moving the holder (i.e., wafer) relative to the probe needles. Therefore, the backside viewing, frontside probing system of integrated circuit test apparatus 210 requires the manual re-setting of all probe needles 240 for each time a new die on inverted wafer 225 is to be electrically probe tested. Manual resetting entails an operator unsecuring a clamp, or other securing device, of member 270 from platen 250. The operator would de-attach member 270 from platen 250, move member 270 and secured wafer 225 each time a new die is to be probed by needles 240. After a die is manually aligned with probe needles 240, member 270 is then re-secured to platen 250. This will then allow the probe needles to contact a corresponding bonding pad, and stimulate the circuitry on the frontside surface of the wafer while, concurrently, microscope 220 examines any radiation emitted therefrom. A short circuit, implant defect, thin film disturbance, or any other processing problem can be detected by examining the radiation effects of that defect when the circuit is stimulated. Camera 221 is used to assist the operator in manually positioning the wafer above the probe needles, so that when member 270 is secured to platen 250, the probe needles will make electrical contact with the corresponding bonding pads. In the case of a flip-chip circuit, the bonding pads include the ball-grid array attributable to a flip-chip bonding arrangement. The resetting process can take up to 15 minutes per probe needle 240, which greatly extends the time required to perform the testing of dice on the wafer.

Optical scanning mechanism 220 is adapted for photo-emissions microscopy, wherein it may include, inter alia, magnifying and focusing lens, a electromagnetic radiation source, and a microscope, where the microscope may de a charged coupled device (CCD). Optical scanning mechanism 220 is positioned over the wafer so as to being viewing the backside surface of the die that is undergoing testing. The die may be electrically test probed with probe needles 240 in contact with the frontside die I/O contacts to provide ground and power to the integrated circuit to ready standby condition, and/or activated the circuits. Concurrently, during said electrical test probing, optical scanning mechanism 220 is optically scanning the backside surface with a beam of electromagnetic radiation in order to detect photoemission-generated defects, which may occur for shorts, juncture leakages, pinhole defects in the oxide layers, latch-up, hot-carrier gate generation, etc. The scanning beam may be a beam of infrared electromagnetic radiation, since lightly doped silicon as seen from the backside surface of the dice on the wafer is readily transparent to this particular wavelength of electromagnetic radiation.

Figure 3:
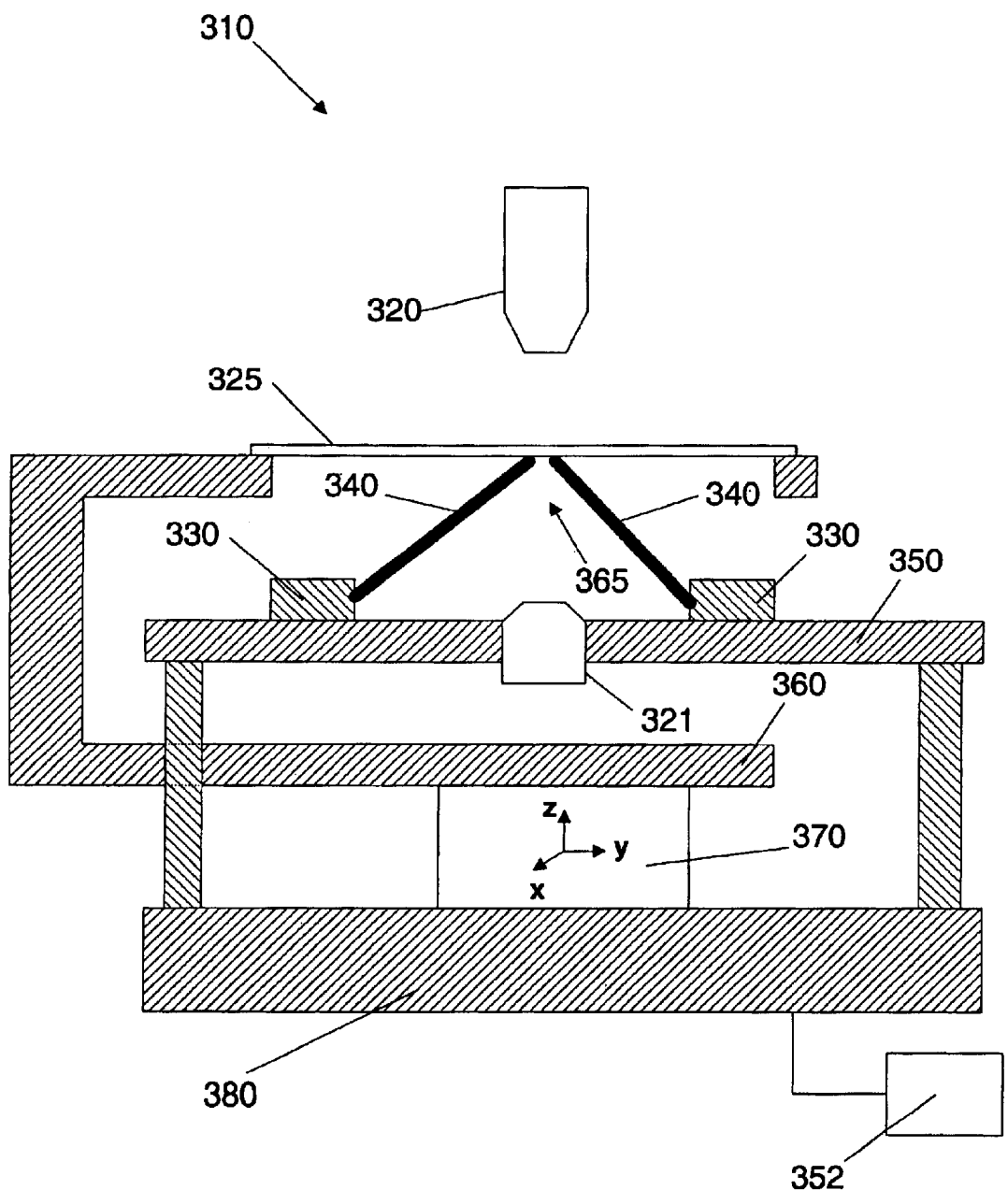
FIG. 3 is a partial cross-sectional view of an automated integrated circuit test apparatus, which allows for backside viewing while probing the frontside surface of a wafer.

FIG. 3 is an illustration of one embodiment of the present invention of an automated integrated circuit test. FIG. 3 is a partial cross-sectional view of integrated circuit test apparatus 310 for backside viewing while conducting automated frontside probing of a wafer, which includes holder 360 mounted to three-dimensional translational mechanism 370. Probe station housing 380 is a base support for integrated circuit test apparatus 310. Holder 360 is designed to receive and retain an outer perimeter of a frontside surface of inverted wafer 325. This can be accomplished by using attachment tabs or may be by applying vacuum pressure from the upper surface of holder 360 to the frontside surface of inverted wafer 325. Furthermore, holder 360 has a circular opening in order to allow probe needle 340 access to the frontside surface of inverted wafer 325. Probe needle 340 is an electrically conductive probe. During testing of the wafer, probe needle 340 is positioned to make electrical contact with an I/O bonding pad on the frontside surface of inverted wafer 325. Probe needle 340 is shown to originate from probe base 330, where probe base 330 may include micropositioning adjusters, which allow for fine adjustment of probe needle 340 in the X, Y, and Z directions.

Camera 321 is preferably attached to platen 350 and enables one to view probe needle 340 in relationship with the wafer for positioning probe needle 340 and/or inverted wafer 325. Also in another embodiment, the probe needle or needles could originate from a probe card which has many probe needles emanating around it circumference for probing the wafer. Furthermore, either probe base 330 or a probe card is electrically connected to a testing control unit 352, which provides electrical power and grounding and sends other electrical signals for testing of the integrated circuits on inverted wafer 325.

Holder 360 is coupled to a three-dimensional translational mechanism 370. Three-dimensional translational mechanism 370 can move holder 360 in the three independent X, Y, and Z directions. In one embodiment holder 360 is attached to a pre-existing wafer chuck of a three-dimensional translational mechanism of a legacy frontside probe device employing automated probing. Furthermore, three-dimensional translational mechanism 370 is electrically connected to a testing control unit 352, which allows for the automatic positioning of the individual die to be tested on inverted wafer 325 by moving holder 360 up and down in the z-plane and incrementally stepping it a predetermined distance in the xy-plane. Typically, the automated probing process begins with the probe needles 340, which may be finely adjusted by said micropostioner adjusters to make contact with appropriate I/O bonding pads of a specific starting die to be tested on inverted wafer 325. This automated process of repositioning of inverted wafer 325 in relationship with probe needles 340 can be done until a select number of all of the dice on the wafer have been tested.

Optical scanning mechanism 320 is adapted for photo-emissions microscopy, wherein it may include, inter alia, a magnifying and focusing lens, an electromagnetic radiation source, and a camera, where the camera may be a charged coupled device (CCD) camera. Optical scanning mechanism 320 is positioned over the wafer so as to being viewing the backside surface of the die that is undergoing electrical testing via the probe needles. The die may be electrically test probed with probe needles 340 in contact with the frontside die I/O contacts to provide grounding and powering up of the integrated circuit to ready standby condition, and/or activated the circuits. Concurrently, during said electrical test probing, optical scanning mechanism 320 is optically scanning the backside surface with a beam of electromagnetic radiation in order to detect photoemission-generated defects, which may occur for shorts, juncture leakages, pinhole defects in the oxide layers, latch-up, hot-carrier gate generation, etc.

The inverted arrangement of backside scanning while probing the frontside of a wafer can advantageously be used in testing a complementary metal oxide semiconductor (CMOS) integrated circuit. Generally speaking, CMOS devices do not consume power as, for example, NMOS devices. CMOS devices also have minimal leakage when both the p- and n-transistors of the complementary pair are "off." During the transition time between an input being driven to its rail, a CMOS device will not experience any direct shorting between a power supply and ground. However, if the probe needle stimulates the CMOS circuit with an input level between the voltage rails, and yet the scanning mechanism 320 indicates a short circuit (e.g., an opaque line appearing when the line should be non-opaque). Optical scanning of a backside surface during operation of circuits on the frontside surface via electrical stimuli from probe needles is not only advantageous when determining a short circuit when a short circuit should not exist, but also can indicate defects in gate dielectrics, gate conductors, local interconnects, junction doping (resistance and drive characteristics), and any other defective feature which could harm the operation or reliability of the integrated circuit.

By attaching holder 360 which securely holds wafer 325 to the x, y, and z translational mechanism 370, wafer 325 can be moved automatically relative to probe needles 340. As noted herein, automated probing entails the movement of the wafer by a motor coupled to the translational member 370 and, thus, holder 360 in the interim between times when each integrated circuit is tested. Accordingly, the system of FIG. 3 allows holder 360 to be set-up so that probe needles 340 are in registry with corresponding bonding pads in the home position. Thereafter, the motor drives the translational member 370 a predefined distance corresponding to the dimensions of each die, and automatically draws the holder downward so that the bonding pads are electrically coupled to the upper-extending probe needles. This is done is an automated, step-and-repeat fashion across the wafer, until all die on the wafer have been probed. Concurrent with one or more of those probe operations, scanning of the backside surface is carried out by scanning mechanism 320.

Camera 321 is used to enable the operator to register translational movement of the wafer so that when the wafer is moved, contact with bonding pads of one die will stay near the relative center of bonding pads of another die, even though the two die may be on opposite ends of the wafer. Pine tuning, or adjustment, of a wafer (and bonding pads) to the probe needles can take place by moving the translational member 370 or the probe base 330 which retains the needles. In many instances, member 370 and base 330 can be rotated by a manual cam mechanism to fine-tune any misalignment between the probe needles and the bonding pads.

An automated step-and-repeat probe mechanism is thereby contemplated. The probe mechanism will move the wafer a predefined amount, which is defined to be consistent as the size of each integrated circuit embodied on the wafer. In other words, the wafer is moved by the translational member 370 in both the x- and y-dimensions governed by the length and width of the die entered into the motor translational unit connected to member 370. Therefore, "consistent" movement of the wafer is predefined, and is herein known to be programmed into the translational motor. By automatically moving the wafer the consistent amount each time, between moments when the frontside surface is probed and the backside surface receives and emits optical energy, the present holder is well-suited to operate upon legacy devices, yet can achieve the aforementioned benefits in an automated setting.

It will be appreciated to those skilled in the art having the benefit of this disclosure that this invention is believed to provide a integrated circuit test apparatus combining a three-dimensional translational mechanism coupled to a wafer holder adapted to allow backside viewing with an optical scanning mechanism of the embedded integrated circuits of an inverted wafer undergoing frontside probing, and a method for such testing of integrated circuits on a wafer. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. An integrated circuit test apparatus, comprising;
    at least one electrically conductive probe needle;
    an optical scan mechanism arranged above the probe needle;
    a holder adapted to receive a wafer while presenting a backside surface of the wafer upward to the optical scan mechanism and an opposing, frontside surface of the wafer downward to the probe needle; and
    a mechanism coupled to the holder for moving the wafer relative to the probe needle.

2. The integrated circuit test apparatus of claim 1, further comprising a positioning camera arranged below the probe needle.

3. The integrated circuit test apparatus of claim 1, further comprising a probe card having trace conductors extending between the test device and the probe needle.

4. The integrated circuit test apparatus of claim 1, wherein the mechanism is adapted for movement in three dimensions relative to the probe needle, to enable the probe needle to contact a bonding pad upon an integrated circuit.

5. The integrated circuit test apparatus of claim 1, wherein the holder is adapted to receive an outer perimeter of the wafer frontside surface by applying vacuum pressure thereto.

6. The integrated circuit test apparatus of claim 1, wherein the holder is adapted to receive an outer perimeter of the wafer frontside surface by tabs arranged intermittently around the outer perimeter.

7. The integrated circuit test apparatus of claim 1, wherein the mechanism moves precisely the width of a die configured on the wafer from the die to each of all neighboring die across the entire wafer in a step-and-repeat fashion only during the interim between when the frontside and backside surfaces are presented to the probe needle and optical scan mechanism, respectively.

8. The integrated circuit test apparatus of claim 1, wherein the optical scan mechanism is adapted to emit radiation upon the backside surface and detect photoemission from the backside surface.

9. The integrated circuit test apparatus of claim 8, wherein the photoemission from the backside surface indicates the amount and/or location of defects on or near the frontside surface.

10. A method for testing an integrated circuit, comprising:
    contacting a frontside surface of the wafer by a probe needle residing beneath the wafer;
    exposing a backside surface of the wafer to an optical scan mechanism residing above the wafer; and
    moving the wafer relative to the probe needle and scan mechanism precisely the width of a die configured on the wafer from the die to each of all neighboring die across the entire wafer in a step-and-repeat fashion during an interim between said contacting and said exposing.

11. The method of claim 10, wherein said contacting and said exposing occur concurrent with one another.

12. The method of claim 10, wherein said moving occurs via a machine.

13. The method of claim 10, wherein said contacting comprises:
    connecting a test device to a bonding pad upon the frontside surface; and
    activating the test device to apply or receive electrical energy to or from the bonding pad.

14. The method of claim 10, wherein said moving comprises retaining an outer perimeter of the wafer to a moveable holder that moves relative the probe needle and the scan mechanism.

15. The method of claim 10, further comprising measuring radiation emanating from the frontside surface, through the backside surface, and upon the scan mechanism.

16. The method of claim 15, wherein said contacting comprises forwarding electrical stimuli into the needle.

17. The method of claim 16, wherein said measuring occurs concurrent with said forwarding of electrical stimuli.

* * * * *